(12) United States Patent  
Damsma et al.

(10) Patent No.: US 12,412,762 B2  
(45) Date of Patent: Sep. 9, 2025

(54) SEMICONDUCTOR SUBSTRATE PROCESSING APPARATUS WITH A TEMPERATURE SENSOR TO MEASURE THE TEMPERATURE OF A BEARING

(71) Applicant: ASM IP Holding B.V., Almere (NL)

(72) Inventors: Wiebren Harm Damsma, Hilversum (NL); Edwin den Hartog-Besselink, Amsterdam (NL); Erik ter Vrugt, Rheden (NL)

(73) Assignee: ASM IP Holding B.V., Almere (NL)

( * ) Notice: Subject to any disclaimer, the term of this patent is extended or adjusted under 35 U.S.C. 154(b) by 561 days.

(21) Appl. No.: 17/850,060

(22) Filed: Jun. 27, 2022

(65) Prior Publication Data

US 2023/0005770 A1   Jan. 5, 2023

Related U.S. Application Data

(60) Provisional application No. 63/216,963, filed on Jun. 30, 2021.

(51) Int. Cl.
*H01L 21/67* (2006.01)
*C23C 16/458* (2006.01)
(Continued)

(52) U.S. Cl.
CPC .... *H01L 21/67248* (2013.01); *C23C 16/4584* (2013.01); *C23C 16/52* (2013.01);
(Continued)

(58) Field of Classification Search
USPC ....... 118/500, 728, 729, 666, 667, 730, 712, 118/713, 725
See application file for complete search history.

(56) References Cited

U.S. PATENT DOCUMENTS 4,764,076 A * 8/1988 Layman ............ H01L 21/67745 414/217
5,421,892 A   6/1995 Miyagi
(Continued)

FOREIGN PATENT DOCUMENTS

CN  111725092 A * 9/2020 ................ F16F 9/34
JP  2003158049 A * 5/2003
(Continued)

OTHER PUBLICATIONS

English Translation CN-111725092 (Year: 2020).*
(Continued)

*Primary Examiner* — Yewebdar T Tadesse
(74) *Attorney, Agent, or Firm* — Snell & Wilmer L.L.P.

(57) ABSTRACT

A semiconductor substrate processing apparatus is provided with a reaction chamber; a heater to heat the reaction chamber; and a substrate support assembly. The substrate support assembly comprising: a substrate support defining an outer support surface for supporting a substrate or substrate carrier in the reaction chamber; and a base assembly including a door for sealing the reaction chamber of the apparatus. The substrate support being connected to the base assembly through a bearing that facilitates rotation of the substrate support. The substrate support assembly is provided with a temperature sensor to measure the temperature of the bearing.

17 Claims, 2 Drawing Sheets

(51) Int. Cl.
*C23C 16/52* (2006.01)
*H01L 21/68* (2006.01)
*H01L 21/687* (2006.01)

(52) U.S. Cl.
CPC .. *H01L 21/68785* (2013.01); *H01L 21/68792* (2013.01); *H01L 21/68742* (2013.01)

(56) References Cited

U.S. PATENT DOCUMENTS

| | | |
|---|---|---|
| 5,540,782 A | 7/1996 | Miyagi |
| 6,235,121 B1 | 5/2001 | Honma |
| 11,306,395 B2 | 4/2022 | Shero |
| 11,339,476 B2 | 5/2022 | Tsuji |
| 2008/0036155 A1 | 2/2008 | Shimazaki |

FOREIGN PATENT DOCUMENTS

| | | | | |
|---|---|---|---|---|
| JP | 2004505446 A | * | 2/2004 | |
| WO | WO-2020145183 A1 | * | 7/2020 | ............. C23C 16/46 |

OTHER PUBLICATIONS

JP-2003158049 (Year: 2003).*
English Translation JP-2004505446 (Year: 2004).*
English Translation WO-2020145183 (Year: 2020).*

\* cited by examiner

SEMICONDUCTOR SUBSTRATE PROCESSING APPARATUS WITH A TEMPERATURE SENSOR TO MEASURE THE TEMPERATURE OF A BEARING

CROSS-REFERENCE TO RELATED APPLICATIONS

This application claims priority to U.S. Provisional Patent Application Ser. No. 63/216,963 filed Jun. 30, 2021 and titled SEMICONDUCTOR SUBSTRATE PROCESSING APPARATUS WITH A TEMPERATURE SENSOR TO MEASURE THE TEMPERATURE OF A BEARING, the disclosure of which is hereby incorporated by reference in its entirety.

FIELD

The present invention relates to the field of semiconductor processing, and more in particular to a semiconductor substrate processing apparatus including a temperature sensor to measure the temperature of a bearing that facilitates rotation of the substrate support.

BACKGROUND

The simultaneous processing of a plurality of semiconductor substrates in a semiconductor substrate processing apparatus presents the problem of how to subject all substrates that are stacked into a substrate carrier to substantially the same process conditions across their respective surface areas. One such process condition is the exposure to process gases. To promote the uniformity of this exposure, a semiconductor substrate processing apparatus may rotate the substrate support defining an outer support surface for supporting a substrate or a substrate carrier during processing so as to average out non-uniformities in process gas flows that contact the substrates.

Another process condition is the temperature of the substrates. To obtain uniform processing results across the substrates, each of the substrates thereof may preferably be heated substantially uniformly to a common temperature by a heater disposed proximate a side wall of the process chamber and/or proximate a top wall of the process chamber. The within-substrate temperature uniformity may also be enhanced by the rotation mechanism.

The rotation may be accomplished by the substrate support being connected to a base assembly through a bearing that facilitates rotation of the substrate support. The bearing may be sensitive to heat which may cause malfunction of the bearing.

SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

It is an objective to provide for a semiconductor substrate processing apparatus with a bearing for rotationally supporting the substrate support whereby the risk of malfunction of the bearing is reduced.

To this end, a first aspect of the invention is directed to a semiconductor substrate processing apparatus. The semiconductor substrate processing apparatus may comprise: a reaction chamber; a heater to heat the reaction chamber; and a substrate support assembly. The substrate support assembly may comprise: a substrate support defining an outer support surface for supporting a substrate or a substrate carrier in the reaction chamber; and a base assembly including a door for sealing the reaction chamber of the apparatus. The substrate support may be connected to the base assembly through a bearing that facilitates rotation of the substrate support relative to the base assembly around a rotation axis. The substrate support assembly may be provided with a temperature sensor constructed and arranged to measure the temperature of the bearing.

The apparatus according to the invention may feature a substrate support assembly, including a rotatable substrate. The substrate support, and any substrates supported thereon (either directly or through the intermediation of a substrate carrier), may be rotated around the rotation axis of the substrate support and relative to a heater. Such rotation averages out the effects of non-uniformities in the (heat profile of) the heater, and promotes the within-substrate temperature uniformity of the supported substrates. The apparatus may be applied in a variety of semiconductor processing devices, including in particular vertical thermal batch furnaces and a single substrate processing apparatus comprising a rotatable substrate support.

These and other features and advantages of the invention will be more fully understood from the following detailed description of certain embodiments of the invention, taken together with the accompanying drawings, which are meant to illustrate and not to limit the invention.

BRIEF DESCRIPTION OF THE DRAWINGS

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION

Figure 1:
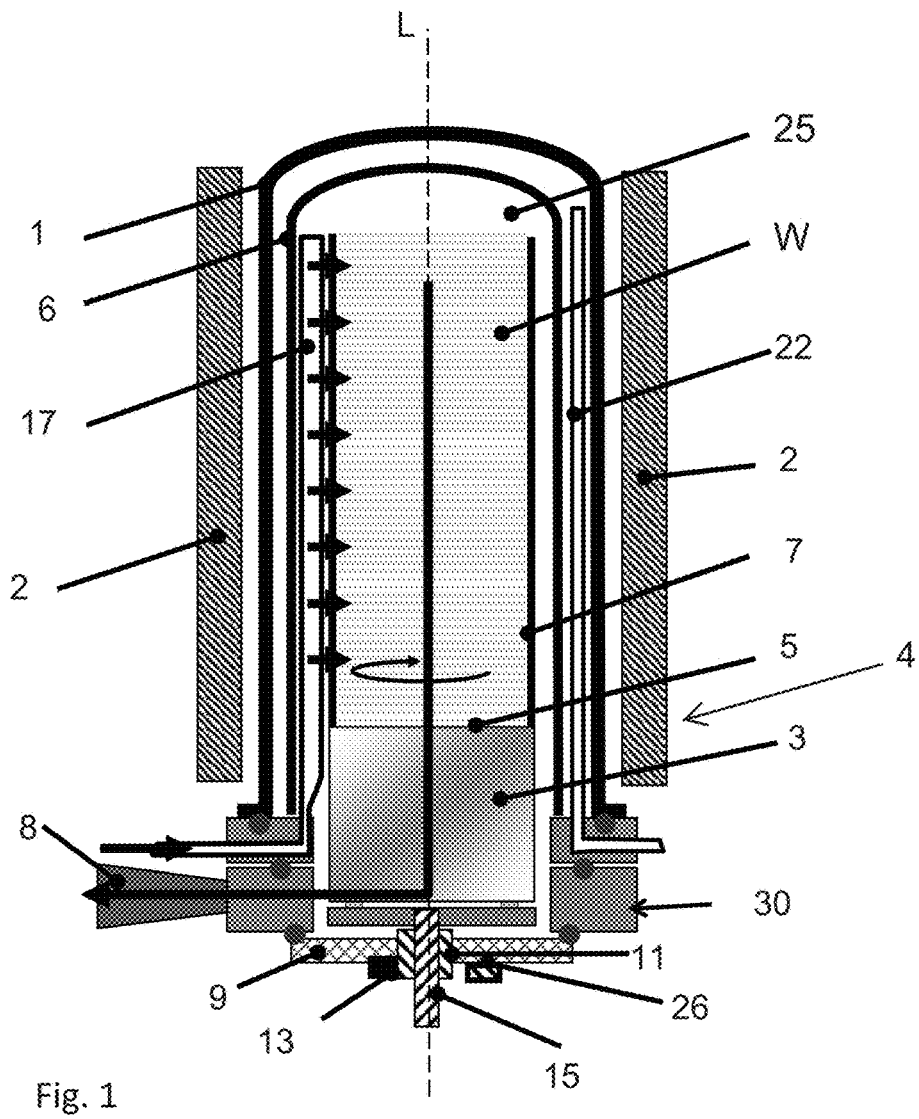
FIG. 1 is a schematic cross-sectional side view of a portion of a first exemplary embodiment of a semiconductor substrate processing apparatus according to an embodiment.

FIG. 1 is a schematic cross-sectional side view of a portion of a first exemplary embodiment of a semiconductor substrate processing apparatus according to an embodiment. In general, semiconductor substrate processing apparatus may, for instance, be of a single or double tube type and include a generally bell jar-shaped reaction chamber 1. The reaction chamber 1 may have a generally tubular, for example circular or polygonal, cross-sectional shape. As regards the manufacturing material, the reaction chamber 1 may be made of quartz, silicon carbide, silicon or another suitable heat resistant material. The reaction chamber 1 may define a reaction space 25 in which substrates can be processed, e.g. be subjected to thermal annealing, etching or deposition treatments.

The reaction chamber 1 may be encircled by a heater 2 for heating substrates W received in the reaction space 25, such as an electrically resistive heating coil powered by an electrical power supply (not shown). The heater 2 may be secured to a thermally insulating sleeve that surrounds the reaction chamber 1. The apparatus may be provided with a liner 6 (for a double tube type apparatus).

A temperature measurement system 22 may be mounted on a flange 30 and extending along an outer surface of the cylindrical wall of the liner 6 towards the top end of the liner 6 to measure a temperature. The temperature measurement system 22 may comprise a beam with a plurality of temperature sensors provided along the length of the beam to measure the temperature at different heights along the liner 2. Since the temperature measurement system 22 is positioned outside the liner 6 deposition may not reach the temperature measurement system 22. This may be beneficial because the deposition may disturb the temperature measurement.

Further the temperature measurement system 22 may comprise quartz and therefore have a different expansion coefficient than the deposited material causing a risk of particles and breaking of the temperature measurement system 22. The liner 6 may be provided with a radially inwardly extending bulge to accommodate the temperature measurement system. At its lower, open end the reaction chamber 1 may be supported on a flange 30 that defines an opening via which a substrate carrier 7 may enter and/or exit the reaction chamber 1.

The substrate carrier 7 may be mounted on an outer support surface 5 of a substrate support 3 or pedestal of a substrate support assembly 4. The substrate carrier 7 may include a plurality of vertically spaced apart slots for holding semiconductor substrates (wafer) W in the reaction chamber 2. The substrate support assembly 4 may further comprise a base assembly 44 including a door 9 for sealing the reaction chamber 1 of the apparatus, the substrate support 3 being connected to the base assembly 44 through a bearing 11 that facilitates rotation of the substrate support 3 relative to the base assembly 44 around a rotation axis L. The reaction chamber 1 may extend along the same rotation axis L.

The substrate support assembly 4 may be provided with a temperature sensor 13 constructed and arranged to measure the temperature of the bearing 11. The temperature sensor 13 may be a resistance temperature sensor. The resistance temperature sensor may be positioned partially around and against the bearing 11.

The bearing 11 may be a roller bearing comprising circular and coaxial races. The bearing 11 may be lubricated with grease. The grease may be running out of the bearing 11 when it gets overheated. Without grease the bearing may not be functioning very well and or very long. Also the bearing 11 may comprise elastic or rubber components that may be sensitive to overheating. Overheating of the bearing 11 therefore should be circumvented.

Figure 2:
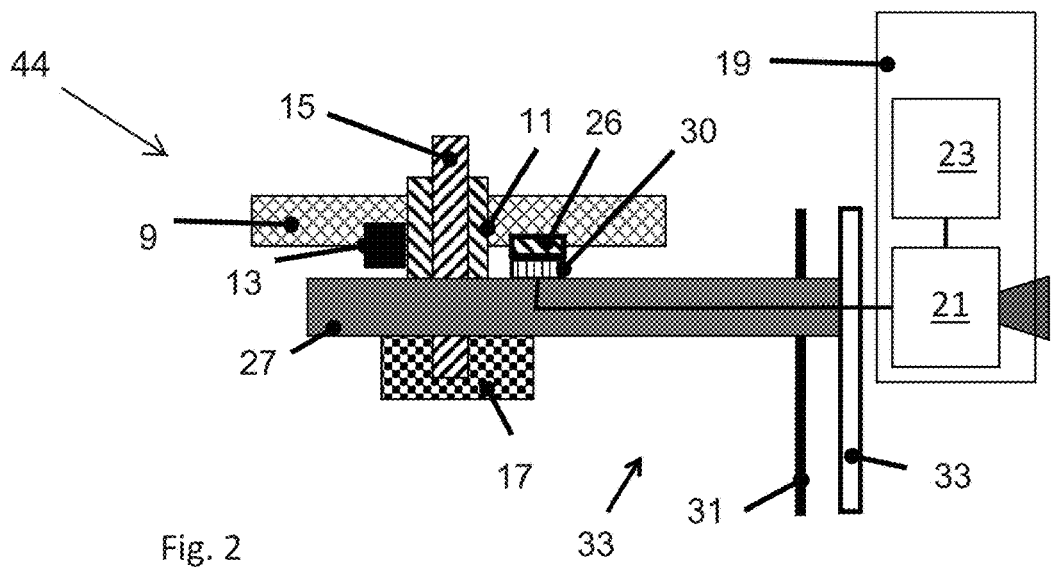
FIG. 2 is an enlarged cross-sectional side view of a portion of the first exemplary embodiment of the semiconductor substrate processing apparatus shown in FIG. 1; and, FIGS. 3a and 3b are schematic bottom views of two type of doors 9 for use in the semiconductor substrate processing apparatus of FIGS. 1 and 2.

Referring to FIG. 2 the temperature sensor 13 may be operably connected to an alarm system 19. The alarm system 19 may comprise a processor 21 and a memory 23. The memory 23 may be constructed and arranged to store an overheating temperature. The processor 21 may compare the temperature of the temperature sensor 13 with the overheating temperature stored in the memory 23 to signal an alarm when the temperature indicated by the temperature sensor 13 is higher than the stored overheating temperature.

Signaling an alarm may be done with sound or visual signals. A sound alarm 24 may therefore be operationally connected to the processor 21. This may allow the user of the apparatus to take measures to circumvent overheating or to plan maintenance on the apparatus. For example the bearing 11 may need to be replaced or lubricated after overheating.

One could also store a heat load over time on the bearing 11 in the memory 23 and use that for predicting maintenance on the bearing 11. For example, the heat load over time stored in the memory 23 could be compared to a reference heat load. Artificial intelligence could be used to predict the reference heat load. For example, by connecting multiple apparatus and use malfunction incidences of the bearing 11 to determine the reference heat load at malfunction to predict maintenance.

The substrate support 3 may be supported on a downwardly protruding drive shaft 15 that extends through a passage in the door 9. The bearing 11 may engage an outer circumference of the drive shaft 15. The bearing 11 may be mounted on the door 9. The temperature sensor may be mounted on the door 9.

The temperature sensor 13 may be operably connected to a door contact pad 26 provided to the door 9. The temperature sensor 13 may be resistance temperature sensor operably connected to two door contact pads 26 provided to the door 9 so that the electrical resistance between the two door contact pads 26 is a function of the temperature. The downwardly protruding drive shaft 15 may be operationally connected to a rotation motor 17 to rotate the drive shaft 15.

The substrate support assembly 4 may be at least partly receivable in said reaction chamber 1. The semiconductor substrate processing apparatus may be provided with an elevator 27 comprising an elevator arm 29 moveable in a substantially vertical direction. In FIG. 2 only the door 9 is shown supported on the elevator arm 29 but in reality the substrate support assembly 4 (including the door 9 and substrate support 3), substrate W and/or the substrate carrier 7 (see FIG. 1) may be supported and moved on the elevator arm 29. The elevator 27 may move the door 9 to substantially seal the opening in the flange 30.

A top surface of the elevator arm 29 may be provided with an elevator arm contact pad 30 constructed and arranged to engage with the door connection pad 26 provided to the door 9. The top surface of the elevator arm 29 may be provided with two or more elevator arm contact pads 30 constructed and arranged to engage with two or more door connection pads 26 provided to the door 9.

The elevator 27 may comprise a substantial vertical glider 33 and ball-screw mechanism 31 rotatable by an elevator motor to move the elevator arm 29 in a substantially vertical direction to move the substrate support assembly 4. The elevator arm 29 may be provided with the rotation motor 17 constructed and arranged to rotate the drive shaft 15 and the substrate support 3 for supporting a substrate or substrate carrier 7 thereon in the reaction chamber 1.

Referring to the configuration of the embodiment of FIGS. 1. The substrate support 3 may include a cylindrical container centered around the rotation axis L. The container may include a substantially flat bottom wall, a cylinder jacket-shaped side wall, and a substantially flat top wall, which walls may be interconnected to form the container. The top wall may provide for the outer, upward facing support surface 5, through which the rotation axis L may extend, preferably perpendicularly thereto. The body of the container, extending between the bottom wall and the top wall, may define an interior space that may be at least partly filled with a thermally insulating material. The insulating material may serve as a heat shield for both the door plate 9 and the flange 30, and help to reduce heat loss via the lower portion of the apparatus.

Figure 3A:
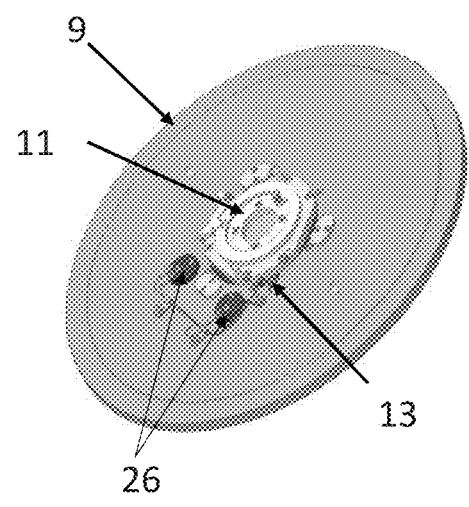
Figure 3B:
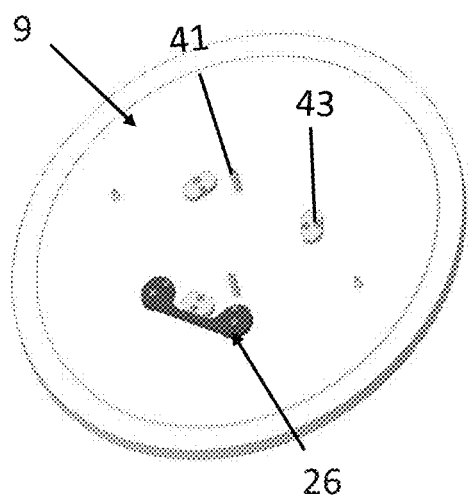

FIGS. 3a and 3b are schematic bottom views of two type of doors 9 for use in the semiconductor substrate processing apparatus of FIGS. 1 and 2. FIG. 3a shows a door 9 provided with a bearing 11, a temperature sensor 13 and two or more door connection pads 26. The two or more door connection pads 26 may be constructed and arranged for engagement with the two or more elevator arm contact pads 30.

FIG. 3b shows a door 9 provided without a bearing and provided with two or more door connection pads 26 which are electrically connected with an below the range resistance. The two or more door connection pads 26 may be constructed and arranged for engagement with the two or more elevator arm contact pads 30.

The memory 23 and the processor 21 may be constructed and arranged to measure a temperature as a function of the resistivity and the memory 23 may be constructed and arranged to store an below the range resistivity. The processor 21 may compare the resistivity of the temperature sensor 13 with the below the range resistivity stored in the memory 23 to signal the presence of a door without rotatable boat when the resistivity is below the range.

FIG. 3b further shows that the door 9 may be provided with alignment pins 41. The alignment pins 41 may be constructed and arranged to cooperate with holes in the elevator arm 27 to position the door on the elevator arm. The door 9 may be provided with support pads 43. The support pads 43 may be constructed and arranged to cooperate with support pads on the elevator arm 27 to position the door on the elevator arm.

When there is no door on the elevator arm contact pads 30 the resistance between the door pads 26 is above the range. The memory 23 and the processor 21 of the alarm system 19 may be constructed and arranged to measure a temperature as a function of the resistivity and the memory 23 is constructed and arranged to store an above the range resistivity. The processor 21 compares the resistivity of the temperature sensor 13 with the above the range resistivity stored in the memory 23 to signal the absence of a door 9 when the resistivity is above the range.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

The invention claimed is:

1. A semiconductor substrate processing apparatus, comprising:
    a reaction chamber;
    a heater to heat the reaction chamber; and,
    a substrate support assembly, comprising:
        a substrate support defining an outer support surface for supporting a substrate or a substrate carrier in the reaction chamber; and
        a base assembly including a door for sealing the reaction chamber of the semiconductor substrate processing apparatus, the substrate support being connected to the base assembly through a bearing that facilitates rotation of the substrate support relative to the base assembly around a rotation axis,
    wherein the substrate support assembly is provided with a temperature sensor constructed and arranged to measure the temperature of the bearing,
    wherein the temperature sensor is provided to the door and operably connected to an alarm system,
    wherein the temperature sensor is operably connected to a door contact pad provided to the door, and
    wherein the temperature sensor is a resistance temperature sensor operably connected to two door contact pads provided to the door so that the electrical resistance between the two door contact pads is a function of the temperature.

2. The apparatus according to claim 1, wherein the bearing is a roller bearing comprising circular and coaxial races.

3. The apparatus according to claim 2, wherein the substrate support is supported on a downwardly protruding drive shaft that extends through a passage through the door, and the bearing engages an outer circumference of the downwardly protruding drive shaft.

4. The apparatus according to claim 3, wherein the downwardly protruding drive shaft is operationally connected to a rotation motor to rotate the downwardly protruding drive shaft, the substrate support defining an outer support surface for supporting a substrate and/or substrate carrier thereon in the reaction chamber.

5. The apparatus according to claim 1, wherein the temperature sensor is operably connected to an alarm system.

6. The apparatus according to claim 5, wherein the alarm system comprises a processor and a memory.

7. The apparatus according to claim 6, wherein the memory is constructed and arranged to store an overheating temperature and the processor compares the temperature of the temperature sensor with the overheating temperature stored in the memory to signal an alarm when the temperature indicated by the temperature sensor is higher than the stored overheating temperature.

8. The apparatus according to claim 1, wherein the reaction chamber defines a reaction space and an opening via which the substrate support assembly is at least partly receivable in said reaction chamber, such that, in a received state of the substrate support assembly, a substrate and/or the substrate carrier supported thereon is received in the reaction space and the door substantially seals said opening.

9. The apparatus according to claim 1, wherein the apparatus is provided with an elevator comprising an elevator arm moveable in a substantially vertical direction to move the substrate support assembly.

10. The apparatus according to claim 9, wherein a top surface of the elevator arm is provided with an elevator arm contact pad constructed and arranged to engage with the door connection pad provided to the door.

11. The apparatus according to claim 10, wherein the top surface of the elevator arm is provided with two elevator arm contact pads constructed and arranged to engage with the two door connection pads provided to the door.

12. The apparatus according to claim 11, wherein the temperature sensor is operably connected to an alarm system comprising a processor and a memory and the processor is constructed and arranged to measure a temperature as a function of the resistivity.

13. The apparatus according to claim 1, wherein the temperature sensor is operably connected to an alarm system comprising a processor and a memory and the processor is constructed and arranged to measure a temperature as a function of the resistivity and the memory is constructed and arranged to store an overheating temperature and the processor compares the temperature of the temperature sensor with the overheating temperature stored in the memory to signal an alarm when the temperature indicated by the temperature sensor is higher than the stored overheating temperature.

14. The apparatus according to claim 9, wherein the elevator comprises a substantial vertical glider and ball-screw rotatable by an elevator motor to move the elevator arm in a substantially vertical direction to move the substrate support assembly.

15. The apparatus according to claim 9, wherein the elevator arm is provided with the rotation motor constructed and arranged to rotate the downwardly protruding drive shaft and the substrate support for supporting a substrate or substrate carrier thereon in the reaction chamber.

16. A semiconductor substrate processing apparatus, comprising:
   a reaction chamber;
   a heater to heat the reaction chamber; and,
   a substrate support assembly, comprising:
      a substrate support defining an outer support surface for supporting a substrate or a substrate carrier in the reaction chamber; and
      a base assembly including a door for sealing the reaction chamber of the semiconductor substrate processing apparatus, the substrate support being connected to the base assembly through a bearing that facilitates rotation of the substrate support relative to the base assembly around a rotation axis,
   wherein the substrate support assembly is provided with a temperature sensor constructed and arranged to measure the temperature of the bearing,
   wherein the temperature sensor is operably connected to an alarm system comprising a processor and a memory and the processor is constructed and arranged to measure a temperature as a function of the resistivity and the memory is constructed and arranged to store an overheating temperature and the processor compares the temperature of the temperature sensor with the overheating temperature stored in the memory to signal an alarm when the temperature indicated by the temperature sensor is higher than the stored overheating temperature, and
   wherein the memory and the processor is constructed and arranged to measure a temperature as a function of the resistivity and the memory is constructed and arranged to store a below the range resistivity and the processor compares the resistivity of the temperature sensor with the below the range resistivity stored in the memory to signal the presence of the door without rotatable boat when the resistivity is below the range.

17. A semiconductor substrate processing apparatus, comprising:
   a reaction chamber;
   a heater to heat the reaction chamber; and,
   a substrate support assembly, comprising:
      a substrate support defining an outer support surface for supporting a substrate or a substrate carrier in the reaction chamber; and
      a base assembly including a door for sealing the reaction chamber of the semiconductor substrate processing apparatus, the substrate support being connected to the base assembly through a bearing that facilitates rotation of the substrate support relative to the base assembly around a rotation axis,
   wherein the substrate support assembly is provided with a temperature sensor constructed and arranged to measure the temperature of the bearing,
   wherein the temperature sensor is operably connected to an alarm system comprising a processor and a memory and the processor is constructed and arranged to measure a temperature as a function of the resistivity and the memory is constructed and arranged to store an overheating temperature and the processor compares the temperature of the temperature sensor with the overheating temperature stored in the memory to signal an alarm when the temperature indicated by the temperature sensor is higher than the stored overheating temperature, and
   wherein the memory and the processor is constructed and arranged to measure a temperature as a function of the resistivity and the memory is constructed and arranged to store an above the range resistivity and the processor compares the resistivity of the temperature sensor with the above the range resistivity stored in the memory to signal the absence of the door when the resistivity is above the range.

* * * * *